(12) United States Patent
Skipor et al.

(10) Patent No.: US 7,989,153 B2
(45) Date of Patent: Aug. 2, 2011

(54) METHOD AND APPARATUS FOR SELECTIVELY PATTERNING FREE STANDING QUANTUM DOT (FSQDT) POLYMER COMPOSITES

(75) Inventors: Andrew F. Skipor, West Chicago, IL (US); Steven M. Scheifers, Hoffman Estates, IL (US)

(73) Assignee: QD Vision, Inc., Watertown, MA (US)

( * ) Notice: Subject to any disclaimer, the term of this patent is extended or adjusted under 35 U.S.C. 154(b) by 735 days.

(21) Appl. No.: 11/776,087

(22) Filed: Jul. 11, 2007

(65) Prior Publication Data

US 2009/0017268 A1 Jan. 15, 2009

(51) Int. Cl.
*G03F 7/00* (2006.01)
*G03F 1/00* (2006.01)
(52) U.S. Cl. .................. 430/322; 430/270.1; 430/320
(58) Field of Classification Search .................. 430/320, 430/270.1, 322
See application file for complete search history.

(56) References Cited

U.S. PATENT DOCUMENTS

| | | | |
|---|---|---|---|
| 5,384,339 A | 1/1995 | Starkey | |
| 6,444,143 B2 | 9/2002 | Bawendi | |
| 6,501,091 B1 | 12/2002 | Bawendi et al. | |
| 6,682,596 B2 | 1/2004 | Zehnder et al. | |
| 6,869,864 B2 * | 3/2005 | Yim et al. | 438/497 |
| 6,890,777 B2 | 5/2005 | Bawendi et al. | |
| 6,914,265 B2 | 7/2005 | Bawendi et al. | |
| 7,122,827 B2 | 10/2006 | Alizadeh et al. | |
| 7,144,458 B2 | 12/2006 | Zehnder et al. | |
| 7,199,393 B2 | 4/2007 | Park et al. | |
| 2002/0123134 A1 * | 9/2002 | Huang et al. | 435/287.2 |
| 2004/0067433 A1 * | 4/2004 | Nirmal et al. | 430/270.1 |
| 2004/0095658 A1 | 5/2004 | Buretea et al. | |
| 2005/0112849 A1 | 5/2005 | Stott et al. | |
| 2006/0068154 A1 | 3/2006 | Parce et al. | |
| 2006/0196375 A1 | 9/2006 | Coe-Sullivan et al. | |
| 2007/0032091 A1 | 2/2007 | Heald et al. | |
| 2008/0001167 A1 | 1/2008 | Coe-Sullivan et al. | |

(Continued)

FOREIGN PATENT DOCUMENTS

JP 2004281954 10/2004

(Continued)

OTHER PUBLICATIONS

Athina Nickitas-Etienne, "Corresponding Application PCT/US2008/068541—PCT International Preliminary Report on Patentability," The International Bureau of WIPO, Geneva, Switzerland, Jan. 21, 2010, 6 pages, most relevant pp. 2, 5-6.

(Continued)

*Primary Examiner* — Thorl Chea

(57) ABSTRACT

Free standing quantum do (FSQDT) polymer composites and a method and apparatus for patterning the FSQDT polymer composites is provided. The method for patterning the FSQDT polymer composites includes creating a solution including FSQDTs where each of the FSQDTs has a plurality of reactive ligands chemically attached thereto. The method further includes providing a substrate, forming a coated substrate by coating a surface of the substrate with a layer of the solution, and providing a photo mask having a predetermined pattern thereon transparent to a predetermined radiation over the coated substrate. Finally, the method includes exposing a portion of the coated substrate to the predetermined radiation passing through the mask to pattern a polymer matrix in the predetermined pattern while adhering the FSQDTs to the polymer matrix to form the FSQDT polymer composite.

13 Claims, 2 Drawing Sheets

U.S. PATENT DOCUMENTS

| | | |
|---|---|---|
| 2008/0169753 A1 | 7/2008 | Skipor et al. |
| 2008/0172197 A1 | 7/2008 | Skipor et al. |
| 2009/0001385 A1 | 1/2009 | Skipor et al. |
| 2009/0001403 A1 | 1/2009 | Skipor et al. |
| 2009/0059554 A1 | 3/2009 | Skipor et al. |
| 2009/0152567 A1 | 6/2009 | Comerford et al. |
| 2009/0162011 A1 | 6/2009 | Coe-Sullivan et al. |
| 2009/0208753 A1 | 8/2009 | Coe-Sullivan et al. |
| 2009/0215208 A1 | 8/2009 | Coe-Sullivan et al. |
| 2010/0265307 A1 | 10/2010 | Linton et al. |

FOREIGN PATENT DOCUMENTS

| | | |
|---|---|---|
| KR | 10-2005-0003548 A | 1/2005 |
| KR | 10-2006-0086128 A | 8/2006 |
| KR | 10-2006-0103356 A | 9/2006 |

OTHER PUBLICATIONS

Sung Jae Maeng, "PCT International Search Report and Written Opinion," WIPO, ISA/KR, Korean Intellectual Property Office, Daejeon, Republic of Korea, Jun. 22, 2009, 11 pages.

Moeller, G., et al. Quantum-Dot Light-Emitting Devices for Displays, Information Display, Feb. 2006.

Coe-Sullivan, S.,et al, Large-Area Ordered Quantum-Dot Monolayers via Phase Separation During Spin-Casting, Adv. Funct. Mater. 2005, 15, 1117-1124.

Coe-Sullivan, S., et al., Tuning the Performance of Hybrid Organic/inorganic Quantum Dot Light-emitting Devices, Organic Electronics, vol. 4, pp. 123-130, 2003.

Coe, S., et al. Electroluminescence from single monolayer of nanocrystals in molecular organic devices, Nature, vol. 420, Dec. 19/26, 2002.

\* cited by examiner

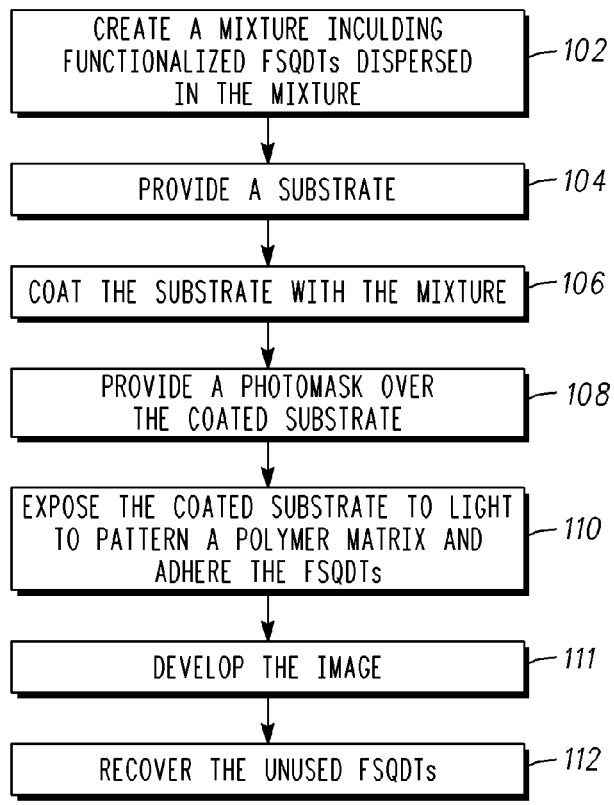
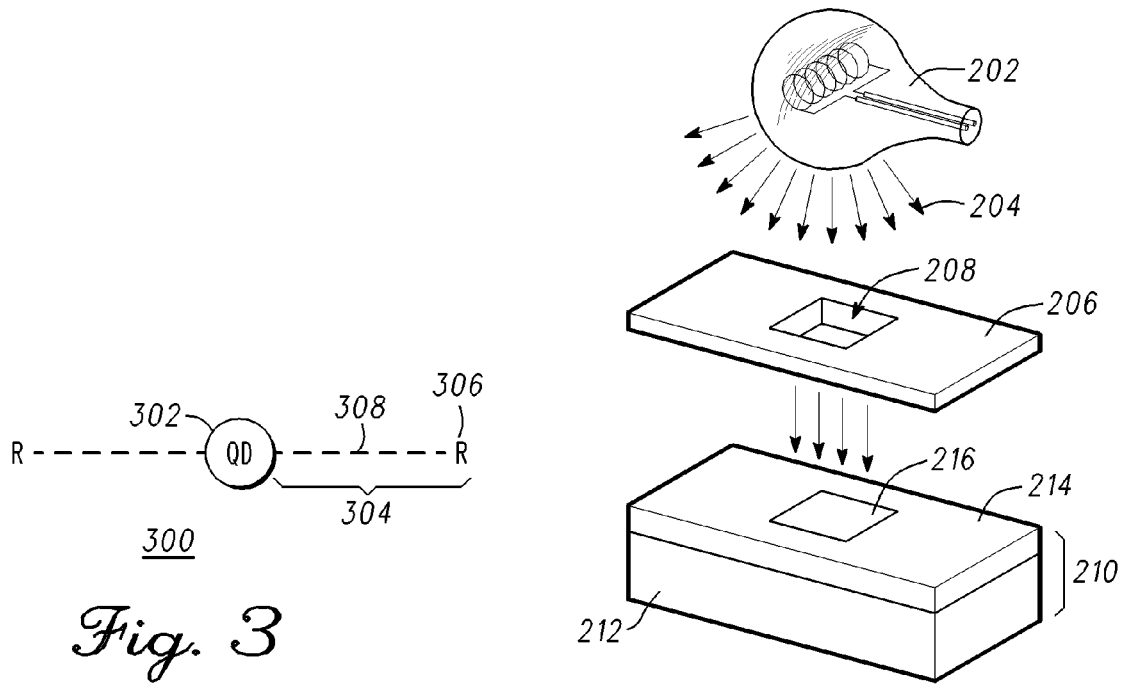

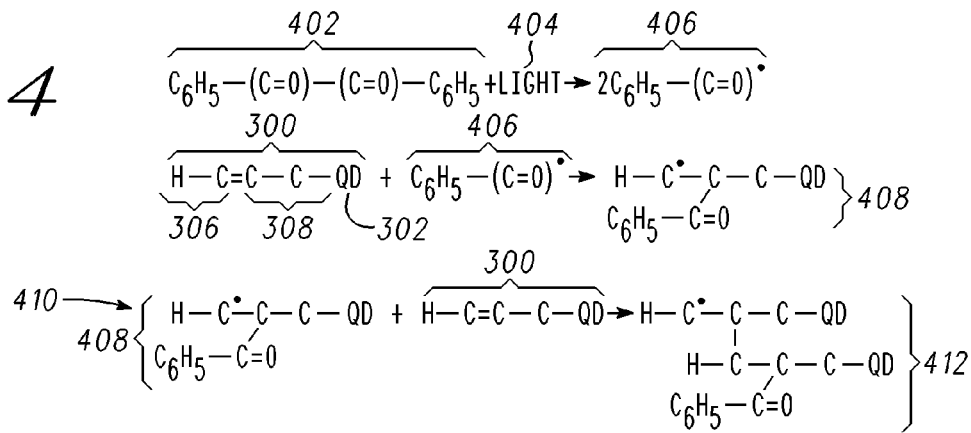
*Fig. 4*
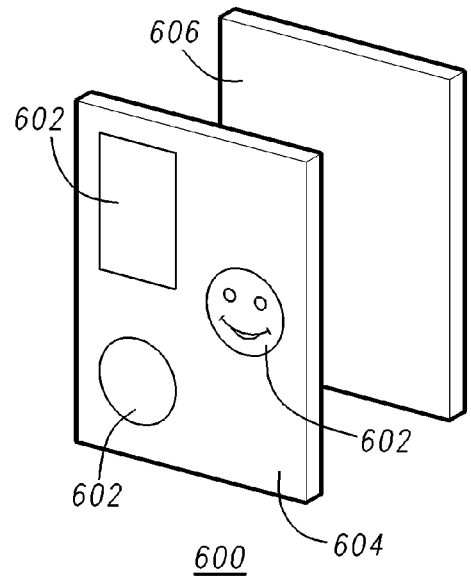
*Fig. 5*
*Fig. 6*
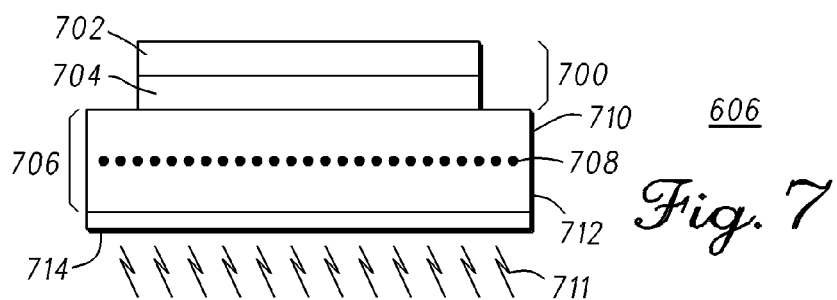
*Fig. 7*

METHOD AND APPARATUS FOR SELECTIVELY PATTERNING FREE STANDING QUANTUM DOT (FSQDT) POLYMER COMPOSITES

FIELD OF THE INVENTION

The present invention generally relates to free standing quantum dot (FSQDT) polymers, and more particularly relates to FSQDT polymer composites and a method and apparatus for patterning FSQDT polymer composites.

BACKGROUND OF THE INVENTION

Free standing quantum dots (FSQDTs) are semiconductor nanocrystallites whose radii are smaller than the bulk exciton Bohr radius and constitute a class of materials intermediate between molecular and bulk forms of matter. FSQDTs are known for the unique properties that they possess as a result of both their small size and their high surface area to volume ratio. For example, FSQDTs typically have larger absorption cross-sections than comparable organic dyes, higher quantum yields, better chemical and photo-chemical stability, narrower and more symmetric emission spectra, and a larger Stokes shift. Furthermore, the absorption and emission properties vary with the particle size and can be systematically tailored. It has been found that a Cadmium Selenium (CdSe) quantum dot, for example, can emit light in any monochromatic, visible color, where the particular color characteristic of that dot is dependent on the size of the quantum dot.

FSQDTs are easily incorporated into other materials such as polymers and polymer composites because FSQDTs are highly soluble and have little degradation over time. These properties allow FSQDT polymers and polymer composites to provide very bright displays, returning almost 100% quantum yield.

Applications for FSQDT polymers and polymer composites include point of purchase and point of sale posters, mobile device housings or logos, segmented displays, including infrared displays, absorbers for infrared sensors or detectors, and light emitting devices (LEDs). Although the visible advantages inherent to FSQDT polymers and polymer composites are attractive, manufacture of products utilizing FSQDTs are problematic. While solution processable methods and structures exist to enable electrically driven FSQDT emission, such methods are not readily scalable and do not enable patterning of a polymer FSQDT composite on many different types of surfaces.

Thus, what is needed is a scalable method that enables surface-independent patterning of FSQDT polymers or polymer composites. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 1 is a flow diagram of a method for photo patterning free standing quantum dot (FSQDT) polymer composites in accordance with an embodiment of the present invention;

FIG. 2 is a diagram of a photo patterning apparatus for performing the method of FIG. 1 in accordance with the embodiment of the present invention;

FIG. 3 depicts a FSQDT with reactive ligands in accordance with the embodiment of the present invention;

FIG. 4 is a chemical flow of the process of photo exposing a FSQDT solution to form a FSQDT polymer composite in accordance with the embodiment of the present invention;

FIG. 5 is a photonically driven patterned FSQDT polymer composite in accordance with the embodiment of the present invention;

FIG. 6 is an apparatus for electrically driving a patterned FSQDT polymer composite in accordance with the embodiment of the present invention; and FIG. 7 is an electronically driven ultraviolet FSQDT emission source for the apparatus of FIG. 6 in accordance with the embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing embodiments in accordance with the present invention in detail, it should be observed that the embodiments reside primarily in combinations of method steps and solublized free standing quantum dot (FSQDT) solutions for photopatterning FSQDT polymer composites as well as methods and apparatus for utilizing the FSQDT polymer composites. Accordingly, the method steps, solutions and apparatus have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises", "includes", "comprising", "including", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more monomers, polymers, or other chemical compounds. While only some exemplary chemicals are recited herein, it is expected that one of ordinary skill, notwithstanding possibly significant effort and many design choices motivated by, for example, available time, current technology, and economic considerations, when guided by the concepts and principles disclosed herein will be readily capable of generating functionally similar solutions, methods for photo patterning and/or apparatus for utilizing FSQDT composites with minimal experimentation.

Accordingly, a method for patterning free standing quantum dot (FSQDT) composites is provided. The method includes creating a mixture including FSQDTs where each of the FSQDTs has a plurality of reactive ligands chemically attached thereto. The method further includes providing a substrate, forming a coated substrate by coating a surface of the substrate with a layer of the solution, and providing a photo mask having a predetermined pattern thereon transparent to a predetermined radiation over the coated substrate. Finally, the method includes exposing a portion of the coated substrate to the predetermined radiation passing through the mask to pattern a polymer matrix in the predetermined pattern while adhering the FSQDTs to the polymer matrix.

A mixture for photo patterning free standing quantum dot (FSQDT) composites includes functionalized FSQDTs dispersed within the solution and a photo-initiator. Each of the functionalized FSQDTs include a ligand attached at a first end to a FSQDT and terminated at the other end by a terminator, which can be a reactive moiety such as a carboxylic acid group. The photo-initiator, in response to being exposed to a predetermined radiation, is reactive with the functionalized FSQDTs to form a polymer matrix having the FSQDTs adhered thereto.

The following detailed description of the invention is merely exemplary in nature and is not intended to limit the invention or the application and uses of the invention. Furthermore, there is no intention to be bound by any theory presented in the preceding background of the invention or the following detailed description of the invention.

Free standing quantum dots (FSQDTs), also known as nano-crystals, are semiconductors composed of periodic groups II-VI, III-V, or IV-VI materials such as Cadmium Sulfide (CdS), Cadmium Selenide (CdSe), Cadmium Telluride (CdTe), Zinc Sulfide (ZnS), Zinc Selenide (ZnSe), Zinc Telluride (ZnTe), Gallium Arsenide (GaAs), Gallium Phosphide (GaP), Gallium Antimonide (GaSb), Mercury Sulfide (HgS), Mercury Selenide (HgSe), Mercury Telluride (HgTe), Indium Arsenide (InAs), Indium Phosphide (InP), Indium Antimonide (InSb), Aluminum Arsenide (AlAs), Aluminum Phosphide (AlP), Aluminum Antimonide (AlSb). Alternative materials that may be used as FSQDTs include but are not limited to tertiary microcrystals such as Indium Caillum Phosphide (InGaP), which emits in the yellow to red wavelengths (depending on its size), and Zinc Selenium Telluride (ZnSeTe), Zinc Cadmium Suflide (ZnCdS), Zinc Cadmium Selenide (ZnCdSe) and Cadmium Selenium Sulfide (CdSeS) which emit in the blue to green wavelengths. Multi-core FSQDT structures are also possible such as ZnSe/ZnXS/ZnS, where the innermost core is made of ZnSe, followed by a second core layer of ZnXS, and completed by an external shell made of ZnS, and where X represents Strontium (Sr), Tellurium (Te), Silver (Ag), Copper (Cu) or Manganese (Mn).

FSQDTs range in size from two to ten nanometers in diameter (approximately $10^2$-$10^7$ total number of atoms). It is only within this range that FSQDTs have size-tunable band gaps, i.e., their spectral emission depends upon their size where the smaller the FSQDTs, the higher the band gap; at a bulk scale, the spectral emission depends solely on the composition of matter. Other advantages of FSQDTs include high photoluminescence quantum efficiencies, good thermal- and photostability, narrow emission line widths (atom-like spectral emissions), and compatibility with solution processing. FSQDTs are typically manufactured by using colloidal solution chemistry.

FSQDTs may be synthesized with a wider band gap outer shell, comprising for example ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs, InN, InP, InSb, AlAs, AlN, AlP, AlSb. The shell surrounds the core FSQDTs and results in a significant increase in the quantum yield. The surface of FSQDTs without a shell has both free electrons in addition to crystal defects. Both of these characteristics tend to reduce quantum yield by allowing for non-radiative electron energy transitions at the surface. The addition of a shell reduces the opportunities for these non-radiative transitions by giving conduction band electrons an increased probability of directly relaxing to the valence band. Thus, capping the FSQDTs with a shell reduces non-radiative recombination and results in brighter emission. The shell also neutralizes the effects of many types of surface defects. The FSQDTs are more thermally stable than organic phosphors since ultraviolet light will not chemically breakdown FSQDTs. The exterior shell can also serve as an anchor point for chemical bonds that can be used to modify and functionalize the surface.

Due to their small size, typically on the order of ten nanometers or smaller, the FSQDTs have larger band gaps relative to a bulk material and the smaller the FSQDTs, the higher the band gap. Therefore, when impacted by a photon (emissive electron-hole pair recombination), the smaller the diameter of the FSQDTs, the shorter the wavelength of light will be released. Discontinuities and crystal defects on the surface of the FSQDT result in non-radiative recombination of the electron-hole pairs that lead to reduced or completely quenched emission of the FSQDT. Therefore, the overcoating outer shell as described above having, for example, a thickness of up to five monolayers and higher band gap compared to the core's band gap is optionally provided around the FSQDT core to reduce the surface defects and prevent this lower emission efficiency. The band gap of the shell material should be larger than that of the FSQDTs to maintain the energy level of the FSQDTs. Capping ligands (molecules) on the outer surface of the shell allow the FSQDTs to remain in the colloidal suspension while being grown to the desired size.

Displays or other emissive apparatus may be created by, among other methods, spin coating, printing, spraying, or ink jetting colloidal suspensions of the FSQDTs. Additionally, a light source (preferably an ultra violet (UV) source) may be disposed to selectively provide photons to strike the FSQDTs, thereby causing the FSQDTs to emit a photon at a frequency comprising the specific color as determined by the size tunable band gap of the FSQDTs.

Referring to FIG. 1, a methodology 100 for patterning FSQDT composites in accordance with the present embodiment is disclosed. The methodology 100 uses photolithography to selectively pattern FSQDT polymer composites with resolution from micron to sub-micron scales. In accordance with the present embodiment, a photo-polymerizable mixture, such as a photo-polymerizable solution or a photo-polymerizable dry film, is created 102 that includes FSQDTs that are, for example, functionalized with photo-polymerizable or chemical-polymerizable polymeric units. Functionalized FSQDTs indicates that the exterior of the FSQDTs or the exterior of the FSQDT shells are functionalized with molecules that can be polymerized using photo-initiation or chemically initiated. For example, this photo-polymerizable mixture can include FSQDTs lightly dispersed at or about a predetermined concentration in a radiation curable polymer matrix or a photo-patternable prepolymer having FSQDTs linked therein. In accordance with this embodiment, a concentration of FSQDTs of approximately 0.01 Molar, i.e., a concentration of 0.01 moles in a volume of one liter, is a preferable upper limit for the predetermined concentration of FSQDTs in the photo-polymerizable mixture. The precise concentration limits in solution or in a solid are related to changes in the refractive index, scattering, self absorption, and energy coupling between the quantum dots and the polymer matrix. Each of these contribute to limit the ultimate brightness of the emission from the FSQDTs.

A substrate is then provided 104 and the photo-polymerizable mixture is printed or deposited 106 on a surface of the substrate to form a coated substrate. The substrate is a material for stabilizing the solution during processing and can be either stiff or flexible and may be composed of either organic or inorganic material. Where the photo-polymerizable mixture is a solution, the solution may be applied onto the surface of the substrate by any of several application methods well-known to those skilled in the art, such as spin coating, curtain coating, rod coating, spray coating, and dipping the solution onto the surface of the substrate. In addition, where the photo-polymerizable mixture is a dry film, the coated substrate may be formed by laminating the dry film onto the surface of the substrate.

Next, a photo mask having a predetermined pattern thereon for patterning the FSQDT composite is provided 108 over the coated substrate for selectively exposing the desired image onto the coated substrate. The pattern on the photo mask is transparent to light at a predetermined radiation, such as ultraviolet light. A portion of the coated substrate is then exposed 110 to the predetermined radiation passing through the photo mask thereby polymerizing the solution in accordance with the predetermined pattern. Polymerizing the solution in accordance with the predetermined pattern forms a polymer matrix which affixes the FSQDTs into the predetermined pattern. For example, polymerizing can form a polymer matrix in the predetermined pattern while adhering (e.g., molecularly bonding) the FSQDTs to each other and to the polymer matrix.

After exposure 110, the image is developed 111 and any unused FSQDTs can be recovered 112 from the developer. Thus, in accordance with the present embodiment, the methodology 100 provides a scalable method that enables the photo-patterning of a polymer FSQDT composite on any surface. The patterned materials can thereafter have further processing performed on them or can be removed and applied to alternate surfaces using an adhesive, can be encapsulated, or can be bonded with hot melt materials.

Referring to FIG. 2, a depiction of the exposure step 108 of the methodology 100 in accordance with the present invention shows a light source 202 providing predetermined radiation 204 to a photo mask 206. The photo mask 206 has a predetermined pattern 208 thereon and is provided above a coated substrate 210. The coated substrate 210 includes a substrate 212 and a photo-polymerizable mixture 214. The substrate 212 can be, for example, flexible polymer film, paper polymer, glass, ceramic, metal, or a semiconductor substrate. The photo-polymerizable mixture 214 includes FSQDTs which can be, for example, functionalized with photo-polymerizable or chemical-polymerizable polymeric units. A patterned polymer composite including FSQDTs is formed in the area 216 photolithographically.

An example of a photo-polymerizable mixture in accordance with the present invention is a solution having FSQDTs dispersed therein, where each of the FSQDTs has a plurality of reactive ligands attached thereto, as described below, such that photo patterning of the solution of the free standing functionalized FSQDT ligands creates a FSQDT polymer composite by linking together the free standing functionalized FSQDT ligands in the solution such that a polymer composite is formed simultaneous with the FSQDTs adhering thereto (i.e., the FSQDTs become part of a polymer backbone of the polymer composite). In other words, the solution in accordance with the present embodiment is a solution of freestanding functionalized FSQDTs dispersed in a reactive polymer matrix where photo patterning the polymeric solution utilizes the functionalized FSQDTs to crosslink the polymer matrix, thereby simultaneously forming the polymer composite while adhering the FSQDTs thereto.

Alternatively, a photo-polymerizable mixture in accordance with the present embodiment can be created 102 by forming prepolymeric oligomers with pendant FSQDT moieties where photo patterning the mixture links the prepolymeric oligomers to form a polymer where the FSQDTs are either part of a polymer backbone or are pendant groups attached to the polymer backbone. In addition, a photo-polymerizable mixture in accordance with the present embodiment can be created 102 by forming a photopatternable prepolymer comprising monomeric units, where each of the monomeric units include a backbone prepolymer having either FSQDTs integral to the backbone prepolymer or FSQDT pendant groups pendant to the backbone prepolymer. Photo patterning the mixture cross-links the photopatternable prepolymer to form a FSQDT polymer matrix.

In addition, a photo-polymerizable mixture in accordance with the present embodiment can be created 102 which includes FSQDTs and a precursor, where the precursor photo-generates a photo-initiator in response to being exposed to a predetermined radiation, the photo-initiator reactive with the predetermined radiation to form a polymer matrix having the FSQDTs adhered thereto. Such photo-polymerizable mixtures may also include a photo-sensitizer where the function of the photo-sensitizer is to cause the precursor to form the photo-initiator by augmenting the precursor action through absorption of wavelengths of radiation outside the range of wavelengths which normally cause the precursor to form the photo-initiator.

Further to the novel mixtures described above which produce a positive pattern at step 110 where the desired final pattern is the exposed pattern, a photo-polymerizable solution for negative photo patterning in accordance with the present embodiment may be created by using a photodegradable polymer matrix containing either free standing functionalized FSQDTs, FSQDTs comprising at least part of the polymer backbone, FSQDTs pendant on the polymer backbone, or a FSQDT cross linked polymer. As those skilled in the art can readily surmise, negative photo patterning would require a modification to step 110 where the mixture applied to the substrate at step 108 is negative photo patterned by exposing areas that are to be removed from the substrate and, thereafter, creating the patterned FSQDT composite by removing the mixture of the exposed areas at step 112.

FIG. 3 depicts a functionalized FSQDT 300 as dispersed in a photo-polymerizable mixture for use in the methodology 100 in accordance with an embodiment of the present invention. The functionalized FSQDT 300 includes a FSQDT (shown in FIG. 3 as "QD" 302) having a plurality of reactive ligands 304 attached thereto. The reactive ligands 304 are terminated by a reactive terminator or radical ("R") 306 for chemically cross-linking the FSQDTs for light-initiated polymerization, each of the reactive terminators 306 attached to the FSQDT 302 by a carbon or silicon chain ("———————") 308 of any length (i.e., the chains 308 attached at one end to the FSQDTs 302 and at the other end to the radicals 306). While only two reactive ligands 304 are shown in the two-dimensional representation of FIG. 3, those skilled in the art will understand that a plurality of reactive ligands 304 are attached to each FSQDT 302 protruding in a three-dimensional nominally radial manner from the FSQDT center, i.e. nominally appearing structurally similar to a micelle.

FIG. 4 shows a chemical flow 400 of a process of photo exposing an exemplary FSQDT solution to form a FSQDT polymer composite in accordance with the methodology 100. The solution shown is an example of a solution in accordance with the present embodiment having dispersed therein the FSQDTs 302 with reactive ligands 304 attached thereto. In accordance with the present embodiment, a precursor 402 is also provided in the solution where the precursor 402, in response to exposure to predetermined radiation 404 at step 110 (FIG. 1), photo-generates a photo-initiator free radical 406, such as benzil (as shown) or benzophenone. The photo-initiator free radical 406 reacts with the reactive terminator 306 of the ligand 304 of each FSQDT 302 to form a free radical 408. The free radicals 408 then react with other reactive terminators 306 of the ligands 304 for polymerization thereof (see chemical equation 410) by cross-linking the ligands 304, thereby forming a polymer matrix 412 in accordance with the present embodiment to create the patterned FSQDT polymer composite. In this manner, polymerization occurs within a photo patterned area prescribed by the predetermined pattern of the photo mask at step 110 wherein the polymer matrix 412 is formed while adhering the FSQDTs to each other and to the polymer matrix in accordance with the present embodiment.

While reactive ligands 304 having reactive terminators 306 are depicted in FIG. 3, functionalized FSQDT in accordance with the present disclosure may also include non-reactive ligands having non-reactive terminators such as a methyl group which need not be involved in chemical reactions in order to pattern the polymer matrix to which the FSQDTs adhere.

An additional exemplary FSQDT solution may be provided in accordance with the present embodiment which includes FSQDTs 302 with ligands 304 terminated by oxirane groups or other cyclic ethers 306 which use anhydride or amine curing as a single part polymerization when the photo patterning is done with light induced Lewis acids such as epoxyacrylate systems. Optionally heat bumping the developed single part epoxy pattern formed from the photo patterning step followed by removal 112 of the unexposed material after the developing step 111 can be used to further set the pattern. One such solution includes a FSQDT functionalized first epoxy resin, a precursor and a second epoxy resin, where the precursor is a photo-initiator that photo-generates a Lewis acid such as diphenyliodonium hexafluoroantimonate. The FSQDT functionalized first epoxy resin is formed by functionalizing FSQDTs to form a pendant FSQDT prepolymer where the pendant FSQDT prepolymer is a polymer formed by providing a first epoxy resin modified with a FSQDT moiety attached at a non-reactive portion of the prepolymer. The second epoxy resin is an epoxy resin which will react with the photo-generated Lewis acid. Thus, when the substrate coated with the solution including an appropriate mix of the FSQDT functionalized first epoxy resin, the second epoxy resin, and the photo-initiator and a photo mask of the desired pattern transparent to radiation appropriate to the photo initiator is positioned over the coated substrate, provision of the appropriate radiation to create the Lewis acid will cause the second epoxy resin to react with the first epoxy resin and form an epoxy polymer with pendant FSQDTs in accordance with the present embodiment. As one skilled in the art will appreciate, there are many epoxy formulations that can be used to form an epoxy polymer with pendant FSQDTs in accordance with the present embodiment.

Alternatively, FSQDTs 302 with mixed ligands 304 attached thereto, where some of the ligands 304 are terminated by amine or amine derivatives or alcohol or alcohol derivatives 306 and other ligands 304 are terminated by carboxylic acid or carboxylic acid derivatives 306. Polymerization of this solution can be hard cross-linked by providing heat to cause amide formation (when amine or amine derivatives are used) or ester formation (when alcohol or alcohol derivatives are used). The photo-patterning is accomplished in accordance with the present embodiment by including a photo-initiator in the solution where the photo-initiator is a precursor that photo-generates a Lewis acid or Lewis base as a catalyst for the cross-linking. By adding an optional heating step (i.e., a "heat bump") to the methodology 100 (FIG. 1) after step 110, the photo-patterned FSQDT polymer composite can be more completely reacted, if necessary, before developing 111. In addition, the developer solution can be used to recover 112 the unused FSQDT polymer for later use. An additional heat bump may be used to further fix the FSQDT polymer composite.

In addition, first FSQDTs having ligands 304 terminated by a carboxylic acid or a carboxylic acid derivative 306 can be blended with second FSQDTs having ligands 304 terminated by either an alcohol or alcohol derivative 306 or an amine or amine derivative 306. Provision of photo-patterning as described above, links the first FSQDTs to the second FSQDTs via an ester or amide bond.

Additional photo-polymerizable mixtures and methods of polymerization are also contemplated for polymerization in accordance with the present invention. For example, another FSQDT mixture in accordance with the present embodiment includes a cross-linking FSQDT curing agent, such as FSQDTs 302 with ligands 304 terminated by an anhydride or amine curing agent, the FSQDT mixture including, for example, an appropriate mix of an FSQDT functionalized epoxy hardener, an epoxy resin, and a photo-initiator. The FSQDT functionalized epoxy hardener is a cross linking FSQDT curing agent, which is a polymer formed by providing an epoxy hardener formed by functionalizing a FSQDT moiety with a reactive ligand such as an omega acrylate thiol. The epoxy resin can be, for example, an acrylated epoxy resin, which will react with the functionalized FSQDT epoxy hardener. And the photo-initiator is a precursor that photo-generates a Lewis acid, such as diphenyliodonium hexafluoroantimonate, that will initiate the hardening process. When radiation is provided for photo patterning by polymerization of the FSQDT mixture the Lewis acid is created by the photo-initiator and causes the FSQDT functionalized epoxy hardener (i.e., the cross linking agent) to react with the acrylated epoxy resin to form an epoxy polymer with the FSQDT crosslinker. Applying a heat bump thereafter will fix the epoxy polymer.

Another FSQDT mixture for photo patterning in accordance with the present embodiment which includes a mixture of functionalized FSQDTs and a photo-initiator may be provided for photo patterning at step 110. The functionalized FSQDTs are FSQDT backbone polymers that can be formed by functionalizing the FSQDT with an alkyl thiol terminated with an omega alkenyl thiol to form functionalized FSQDTs having omega alkenyl thiol ligands attached thereto. The mixture is then applied to the substrate 212 (FIG. 2), where the mixture is an appropriate mixture of the functionalized FSQDTs and the photo-initiator so that when a photo mask of the desired pattern transparent to radiation appropriate to the photo initiator is positioned over the coated substrate and the pattern is aligned as desired with the substrate, a patterned FSQDT polymer composite is formed. Hence, in accordance with the present embodiment, provision of the appropriate radiation to the mixture comprising the functionalized FSQDTs and the photo-initiator creates free radicals in the photo-initiator which subsequently react with the omega alkenyl thiol ligands of the functionalized FSQDTs to cause them to link the functionalized FSQDTs together, thereby forming the FSQDT polymer composite.

Utilizing photo-polymerizable solutions in accordance with the present embodiment, the photo-patterned FSQDT polymer composite can provide very bright displays, returning almost 100% quantum yield. Applications for the photo-patterned FSQDT polymer composite include point of purchase and point of sale posters, mobile device housings or logos, segmented displays, including infrared displays, absorbers for infrared sensors or detectors, and light emitting devices (LEDs). One could conceivably utilize the methodology 100 in accordance with the present embodiment to integrate the display key pad and lighting by selective lithography of light emitting sources directly onto the printed wiring board, thereby allowing a scalable method for producing LEDs of varying colors.

Referring to FIG. 5, the resulting photo-patterned material 216 formed on a substrate 212 is a patterned matrix and includes FSQDTs. The material 216 is typically a FSQDT polymer composite and generally includes a photo-initiator or photo-initiator residue, where the photo-initiator residue is photo induced reaction products produced from the photo-initiator. The substrate 212 can be, for example, flexible polymer film, paper polymer, glass, ceramic, metal, or a semiconductor substrate with the photo-patterned material 216 formed directly thereon. In addition, the patterned substrate 212 can be applied to alternate surfaces using an adhesive, can be encapsulated, or can be bonded with hot melt materials. Once provided in a display, the photo-patterned portion, which may provide a logo, a poster or a decal, can be photonically driven by exposing the one or more photo-patterned FSQDT materials 216 to an ultra-violet or blue emission source, thereby advantageously providing a very bright display. In addition, the colors of the photo-patterned portion can utilize known FSQDT properties to be color-tunable, thereby enabling color matching. For example, since quantum confinement of both the electron and hole in all three dimensions leads to an increase in the effective band gap of FSQDTs with decreasing crystallite size, both the optical absorption and emission of quantum dots shift to the blue (higher energies) as the size of the dots gets smaller. It has been found that a Cadmium Selenium (CdSe) quantum dot, for example, can emit light in any monochromatic, visible color, where the particular color characteristic of that dot is dependent on its size.

Referring to FIG. 6, an apparatus 600 for electrically and photonically driving patterned FSQDT materials 602 having one or more colors on a surface 604 is shown. For example, a poster 604 with laminated FSQDT composite portions as materials 602 attached thereto. Alternatively, a display 604 could have pre-patterned FSQDT segments as materials 602 or large or small pixels as materials 602. A primary emission source 606 is a FSQDT electronic emission source 606 which can selectively provide ultraviolet light from ultraviolet-emitting FSQDTs, such as Zinc Sulfide (ZnS) or Zinc Selenide (ZnSe), to portions of the surface 604 to excite the FSQDT materials 602 thereon. In addition to the primary emission source 606 being an ultraviolet-emitting fluorescent compact light source as described hereinabove, the primary emission source 606 may include light emitting devices (LEDs) coupled to a wave guide or a light source emitting blue light or light having a shorter wavelength than the desired emitted color.

Referring to FIG. 7, an exemplary implementation of the FSQDT electronic emission source assembly 606 is shown. The electronic emission source assembly 606 includes a plurality of electron generating elements 700 including contacts 702 formed of a conductive metal such as silver connected to an electron generating layer 704. When current is provided to the contacts 702, the charge causes the electron generating layer 704, formed of an electron generating material such as a magnesium silver alloy, to provide electrons to a portion of an active layer 706 of the emission source 606 coupled thereto. The active layer 706 includes a layer of ultraviolet-emitting FSQDTs 708 sandwiched between an organic or inorganic electron transport layer 710 on one side and an organic or inorganic hole transport layer 712. Adjacent to the hole transport layer 712 is a transparent conductive layer 714, such as a transparent indium tin oxide (ITO) conductive layer. The electrons flowing into the electron transport layer 710 flow through the layer of FSQDTs 708 to the hole transport layer 712, thereby exciting the FSQDTs to emit UV or blue light 716 through the transparent conductive layer 714 for provision to the display 604 for excitation of the FSQDT segments 602 (FIG. 6). In this manner, selectable electrical excitation of FSQDT segments 602 photo patterned in accordance with the present embodiment may be accomplished.

Thus it can be seen that solutions and a scalable method have been provided which advantageously enables the photo-patterning of a polymer FSQDT composite on any surface which can be photonically or electrically driven to provide a bright, color-tunable display. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for patterning free standing quantum dot (FSQDT) composites, the method comprising the steps of:
   forming a photopatternable prepolymer having FSQDTs linked therein, wherein the step of forming the photopatternable prepolymer comprises the step of functionalizing the FSQDTs with an alkyl thiol terminated with an omega alkenyl thiol to form FSQDT backbone polymers;
   providing a substrate;
   forming a coated substrate by coating a surface of the substrate with a layer of the photopatternable prepolymer,
   providing a photo mask having a predetermined pattern thereon transparent to a predetermined radiation over the coated substrate; and
   exposing a portion of the coated substrate to the predetermined radiation passing through the mask to pattern the photopatternable prepolymer in the predetermined pattern, including the FSQDTs.

2. The method in accordance with claim 1 further comprising the step of creating a mixture comprising the FSQDT backbone polymers and a photo-initiator, wherein the step of forming the coated substrate comprises the step of forming the coated substrate by applying the mixture to the surface of the substrate.

3. The method in accordance with claim 2 wherein the FSQDT backbone polymers are ultraviolet curable backbone polymers, and wherein the predetermined radiation comprises ultraviolet light.

4. The method in accordance with claim 2 wherein the step of creating the mixture comprises the step of creating a mixture comprising the FSQDT backbone polymers as a plurality of functionalized FSQDTs, wherein each of the plurality of functionalized FSQDTs comprise functionalized FSQDTs having omega alkenyl thiol ligands attached thereto.

5. The method in accordance with claim 1 wherein the predetermined radiation comprises ultraviolet light.

6. The method in accordance with claim 1 wherein the step of forming the coated substrate comprises the step of applying the photopatternable prepolymer to the substrate by a method selected from the group of application methods comprising spin coating, curtain coating, rod coating, spray coating, and dipping the photopatternable prepolymer onto the surface of the substrate.

7. The method in accordance with claim 1 wherein the FSQDTs comprise quantum dots selected from the group of quantum dots comprising single core quantum dots and multi-core quantum dots.

8. The method in accordance with claim 7 wherein the single core quantum dots comprise quantum dots selected from the group of quantum dots comprising Cadmium Sulfide (CdS), Cadmium Selenide (CdSe), Cadmium Telluride (CdTe), Zinc Sulfide (ZnS), Zinc Selenide (ZnSe), Zinc Telluride (ZnTe), Gallium Arsenide (GaAs), Gallium Phosphide (GaP), Gallium Antimonide (GaSb), Mercury Sulfide (HgS), Mercury Selenide (HgSe), Mercury Telluride (HgTe), Indium Arsenide (InAs), Indium Phosphide (InP), Indium Antimonide (InSb), Aluminum Arsenide (AlAs), Aluminum Phosphide (AlP), Aluminum Antimonide (AlSb), Indium Gallium Phosphide (InGaP), Zinc Selenium Telluride (ZnSeTe), Zinc Cadmium Sulfide (ZnCdS), Zinc Cadmium Selenide (ZnCdSe) and Cadmium Selenium Sulfide (CdSeS).

9. The method in accordance with claim 7 wherein the multi-core quantum dots comprise ZnSe/ZnXS/ZnS quantum dots having an innermost shell comprising ZnSe, a second core layer comprising ZnXS and an external shell comprising ZnS, where X represents an element selected from the group of elements comprising Strontium (Sr), Tellurium (Te), Silver (Ag), Copper (Cu) or Manganese (Mn).

10. The method in accordance with claim 1 further comprising the step of:
removing unexposed portions of the photopatternable prepolymer from the coated substrate.

11. The method in accordance with claim 1 wherein the substrate comprises a substrate selected from the group comprising flexible polymer film, paper polymer, glass, ceramic, metal, and semiconductor substrate.

12. The method in accordance with claim 1 wherein the step of exposing the portion of the coated substrate comprises the step of exposing a portion of the coated substrate to the predetermined radiation passing through the mask to cross-link the photopatternable prepolymer to form a FSQDT polymer matrix in the predetermined pattern.

13. A method for patterning free standing quantum dot (FSQDT) composites, the method comprising the steps of:
forming a photopatternable prepolymer having FSQDTs linked therein, wherein the step of forming the photopatternable prepolymer comprises the step of functionalizing the FSQDTs with an alkyl thiol terminated with an omega alkenyl thiol to form FSQDT backbone polymers;
creating a mixture comprising the FSQDT backbone polymers, wherein the step of creating the mixture comprises the step of creating a mixture comprising the FSQDT backbone polymers as a plurality of functionalized FSQDTs and a photo-initiator, wherein each of the plurality of functionalized FSQDTs comprise functionalized FSQDTs having omega alkenyl thiol ligands attached thereto;
providing a substrate;
forming a coated substrate by coating a surface of the substrate with a layer of the photopatternable prepolymer, wherein the step of forming the coated substrate comprises the step of forming the coated substrate by applying the mixture to the surface of the substrate;
providing a photo mask having a predetermined pattern thereon transparent to a predetermined radiation over the coated substrate; and
exposing a portion of the coated substrate to the predetermined radiation passing through the mask to pattern the photopatternable prepolymer in the predetermined pattern, including the FSQDTs, wherein the step of exposing the portion of the coated substrate comprises the step of exposing the portion of the coated substrate to the predetermined radiation passing through the mask to pattern the photopatternable prepolymer in the predetermined pattern by creating free radicals in the photo-initiator which chemically react with the omega alkenyl thiol ligands of the functionalized FSQDTs to bond the functionalized FSQDTs together to form a FSQDT polymer matrix in the predetermined pattern.

* * * * *